(12) United States Patent
Huang et al.

(10) Patent No.: US 10,157,849 B2
(45) Date of Patent: Dec. 18, 2018

(54) PACKAGES WITH MOLDING STRUCTURES AND METHODS OF FORMING THE SAME

(71) Applicant: Taiwan Semiconductor Manufacturing Company, Ltd., Hsinchu (TW)

(72) Inventors: Chih-Fan Huang, Kaohsiung (TW); Cheng-Tar Wu, Jhongli (TW); Ming-Da Cheng, Jhubei (TW); Chung-Shi Liu, Hsinchu (TW); Chen-Hua Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 19 days.

(21) Appl. No.: 15/443,490

(22) Filed: Feb. 27, 2017

(65) Prior Publication Data

US 2017/0170124 A1    Jun. 15, 2017

Related U.S. Application Data

(62) Division of application No. 14/446,583, filed on Jul. 30, 2014, now Pat. No. 9,601,353.

(51) Int. Cl.
*H01L 23/538* (2006.01)
*H01L 21/56* (2006.01)
(Continued)

(52) U.S. Cl.
CPC ........ *H01L 23/5389* (2013.01); *H01L 21/481* (2013.01); *H01L 21/486* (2013.01); *H01L 21/4853* (2013.01); *H01L 21/4857* (2013.01); *H01L 21/565* (2013.01); *H01L 23/295* (2013.01); *H01L 23/3114* (2013.01); *H01L 23/49811* (2013.01); *H01L 23/5383* (2013.01); *H01L 23/5384* (2013.01); *H01L 23/5386* (2013.01); *H01L 24/19* (2013.01); *H01L 24/20* (2013.01); *H01L 24/97* (2013.01); *H01L 25/105* (2013.01); *H01L 25/50* (2013.01); *H01L 23/3121* (2013.01); *H01L 23/49816* (2013.01);
(Continued)

(58) Field of Classification Search
CPC ............ H01L 23/5389; H01L 23/5383; H01L 23/5384; H01L 23/5386; H01L 23/3114; H01L 21/4853; H01L 21/4857; H01L 21/486; H01L 21/565; H01L 25/105; H01L 25/50; H01L 2225/1058; H01L 2225/1035
See application file for complete search history.

(56) References Cited

U.S. PATENT DOCUMENTS 7,361,533 B1 * 4/2008 Huemoeller ........ H01L 23/3128 438/123
8,937,381 B1 * 1/2015 Dunlap ............... H01L 23/3128 257/686
(Continued)

*Primary Examiner* — A. Sefer
(74) *Attorney, Agent, or Firm* — Slater Matsil, LLP

(57) ABSTRACT

A method includes molding a device die in a molding material, wherein a metal pillar of the device die is exposed through a surface of the molding material. A substrate is adhered to the molding material. The substrate includes a redistribution layer that further includes redistribution lines. A plating is performed to fill a through-opening in the substrate to form a through-via. The through-via is plated on the metal pillar of the device die. An electrical connector is formed to electrically couple to the through-via.

20 Claims, 12 Drawing Sheets

(51) Int. Cl.
*H01L 21/48* (2006.01)
*H01L 25/10* (2006.01)
*H01L 23/29* (2006.01)
*H01L 23/00* (2006.01)
*H01L 25/00* (2006.01)
*H01L 23/498* (2006.01)
*H01L 23/31* (2006.01)

(52) U.S. Cl.
CPC ............... *H01L 23/49827* (2013.01); *H01L 2224/0401* (2013.01); *H01L 2224/04042* (2013.01); *H01L 2224/04105* (2013.01); *H01L 2224/12105* (2013.01); *H01L 2224/16227* (2013.01); *H01L 2224/18* (2013.01); *H01L 2224/19* (2013.01); *H01L 2224/24137* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2224/97* (2013.01); *H01L 2225/1035* (2013.01); *H01L 2225/1041* (2013.01); *H01L 2225/1058* (2013.01); *H01L 2924/15311* (2013.01); *H01L 2924/18162* (2013.01)

(56) References Cited

U.S. PATENT DOCUMENTS

| | | | |
|---|---|---|---|
| 2013/0256900 A1* | 10/2013 | McConnelee | H01L 23/5383 257/774 |
| 2014/0091471 A1* | 4/2014 | Chen | H01L 24/19 257/770 |
| 2014/0124949 A1 | 5/2014 | Paek et al. | |
| 2014/0367160 A1* | 12/2014 | Yu | H01L 21/568 174/377 |
| 2015/0084191 A1 | 3/2015 | Lin et al. | |
| 2015/0171006 A1 | 6/2015 | Hung et al. | |
| 2015/0262909 A1* | 9/2015 | Chen | H01L 21/6835 257/774 |
| 2016/0013147 A1 | 1/2016 | Cheng et al. | |

* cited by examiner

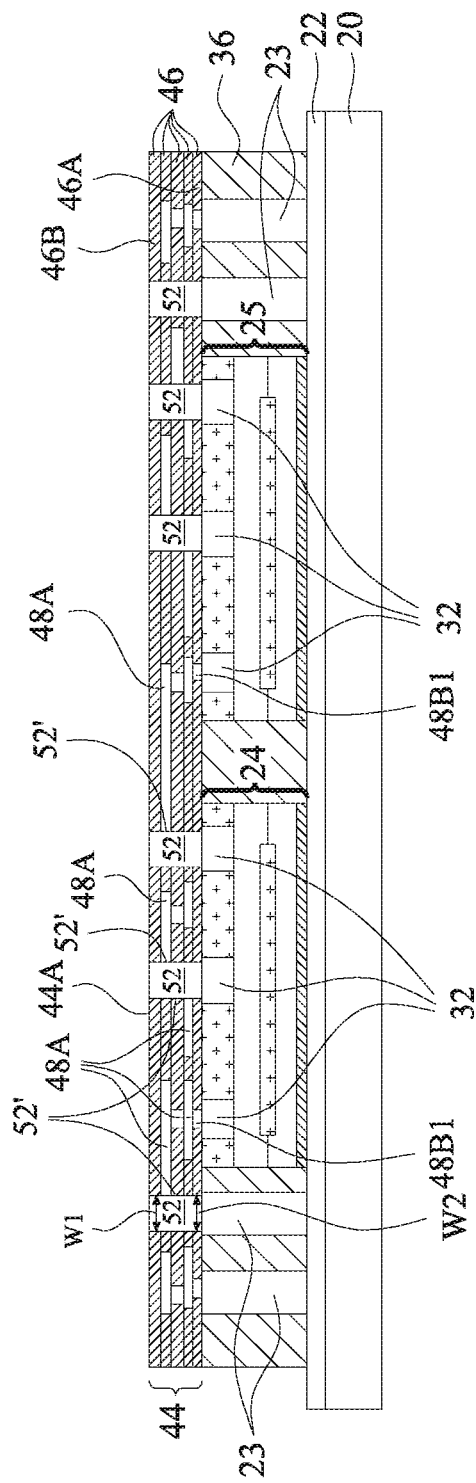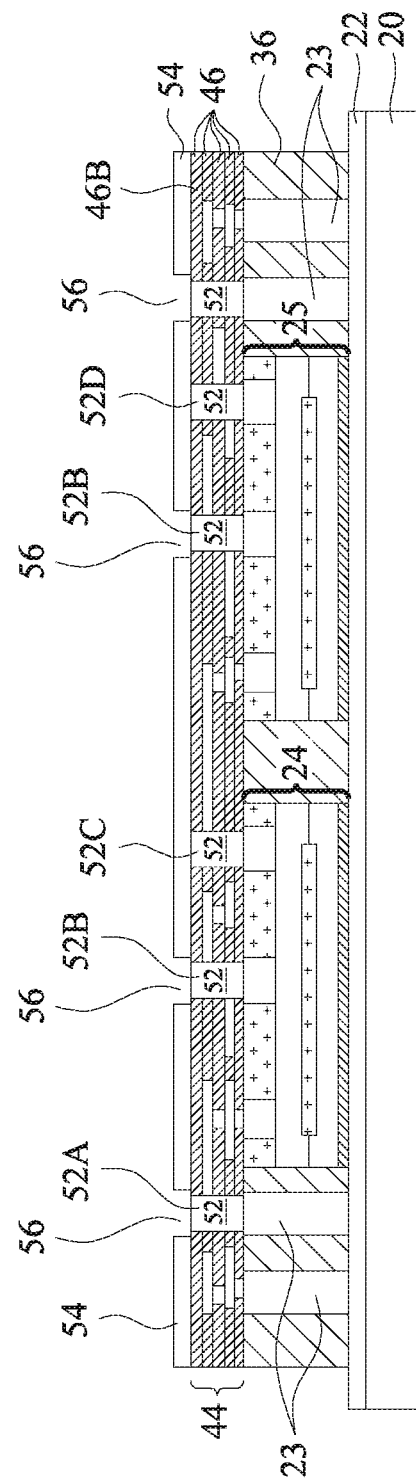
FIG. 8
FIG. 9

PACKAGES WITH MOLDING STRUCTURES AND METHODS OF FORMING THE SAME

PRIORITY CLAIM AND CROSS-REFERENCE

This application is a divisional of U.S. patent application Ser. No. 14/446,583, entitled "Packages with Molding Structures and Methods of Forming the Same," filed on Jul. 30, 2014, which application is incorporated herein by reference.

BACKGROUND

The fabrication of modern circuits typically involves several steps. Integrated circuits are first fabricated on a semiconductor wafer, which contains multiple duplicated semiconductor chips, each comprising integrated circuits. The semiconductor chips are then sawed from the wafer and packaged. The packaging processes have two main purposes: to protect delicate semiconductor chips and connect interior integrated circuits to exterior pins.

With the increasing demand for more functions, Package-on-Package (PoP) technology, in which two or more packages are bonded in order to expand the integration ability of the packages, was developed. With a high degree of integration, the electrical performance of the resulting PoP package can be improved due to the shortened connecting paths between components. By using the PoP technology, package design becomes more flexible and less complex. Time-to-market is also reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 13 are cross-sectional views of intermediate stages in the formation of packages in accordance with some embodiments;

DETAILED DESCRIPTION

Figure 1:

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packages and the methods of forming the same are provided in accordance with various embodiments. The intermediate stages of forming the packages are illustrated. The variations of the embodiments are discussed. Throughout the various views and illustrative embodiments, like reference numbers are used to designate like elements.

Figure 16:
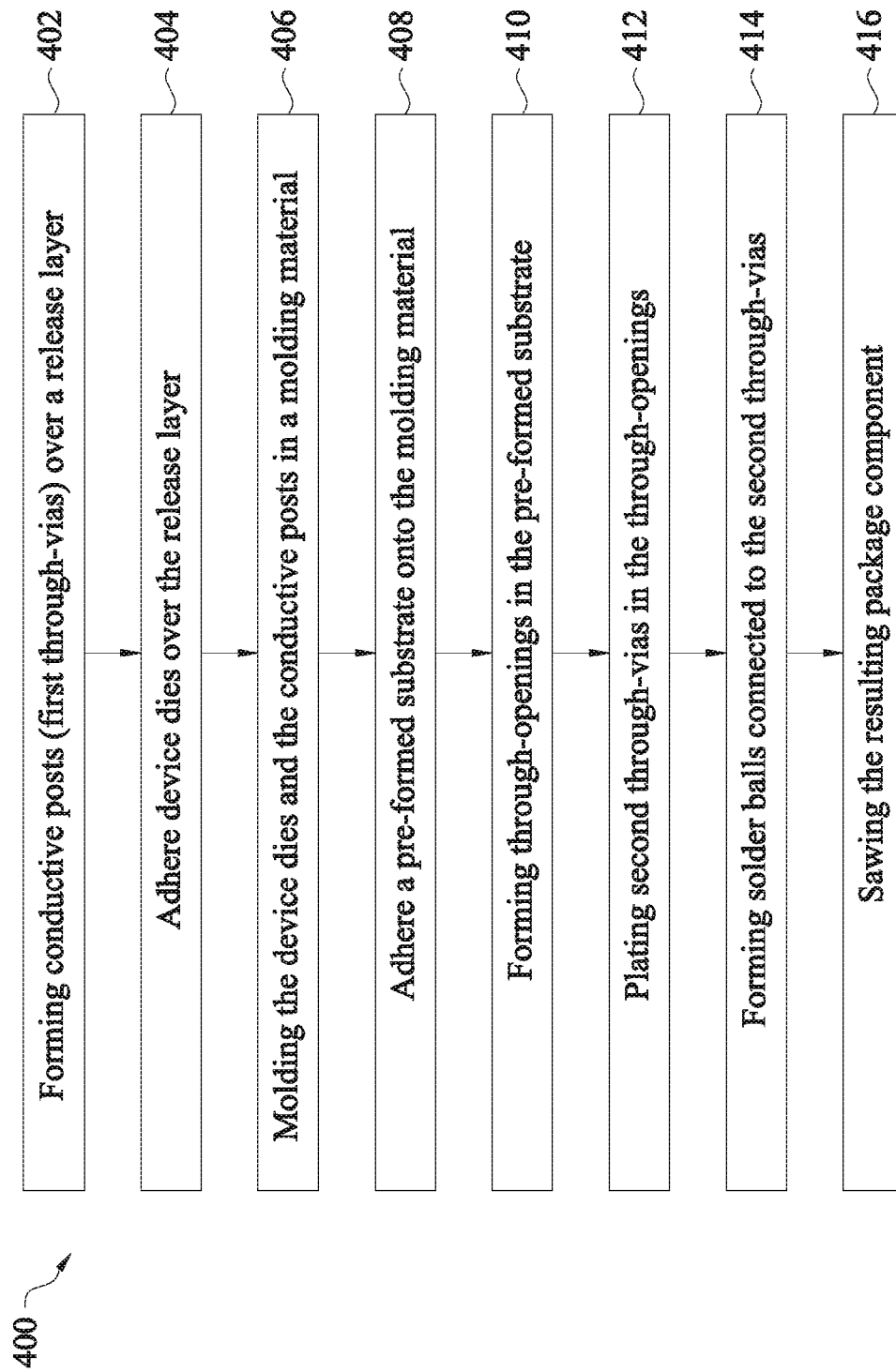
FIG. 16 illustrates a process flow in accordance with some embodiments.

FIGS. 1 through 13 illustrate the cross-sectional views of intermediate stages in the formation of an interconnect structure in accordance with some embodiments. The steps shown in FIGS. 1 through 13 are also illustrated schematically in the process flow 400 as shown in FIG. 16. In the subsequent discussion, the process steps shown in FIGS. 1 through 13 are discussed, referring to the process steps in FIG. 16.

FIG. 1 illustrates carrier 20 and release layer 22 formed on carrier 20. Carrier 20 may be a glass carrier, a ceramic carrier, or the like. Carrier 20 may have a round top-view shape and may have the size of a silicon wafer. Release layer 22 may be formed of a polymer-based material, which may be removed along with carrier 20 from the overlying structures formed in subsequent steps. In accordance with some embodiments of the present disclosure, release layer 22 is formed of an epoxy-based thermal-release material. Release layer 22 may also be referred to as a Light-To-Heat Conversion (LTHC) layer in some embodiments, which is capable of releasing the structures formed thereon under the heat of the light. For example, release layer 22 may be formed of an Ultra-Violet (UV) glue. Release layer 22 may be dispensed as a liquid and cured. In alternative embodiments, release layer 22 is a laminate film and is laminated onto carrier 20. The top surface of release layer 22 is coplanar and has a high degree of co-planarity.

Figure 2:
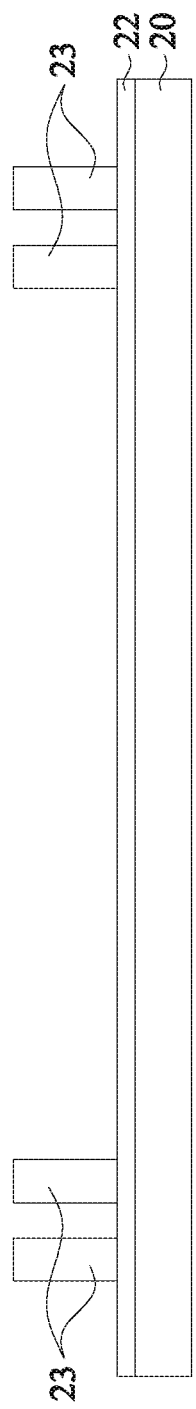

Referring to FIG. 2, conductive posts 23 are formed. The respective step is step 402 as shown in FIG. 16. Throughout the description, conductive posts 23 are alternatively referred to as through-vias 23 since conductive posts 23 penetrate through the subsequently formed molding material. In accordance with some embodiments of the present disclosure, through-vias 23 are pre-formed and are then placed on release layer 22. In alternative embodiments, through-vias 23 are formed by plating. The plating of through-vias 23 may include forming a seed layer (not shown) over release layer 22, forming and patterning a photo resist (not shown), and plating through-vias 23 on the portions of the seed layer that are exposed through the openings in the photo resist. The photo resist and the portions of the seed layer that were covered by the photo resist are then removed. The material of through-vias 23 may include copper, aluminum, or the like. Through-vias 23 have the shape of rods. The top-view shapes of through-vias 23 may be circles, rectangles, squares, hexagons, or the like.

Figure 3:
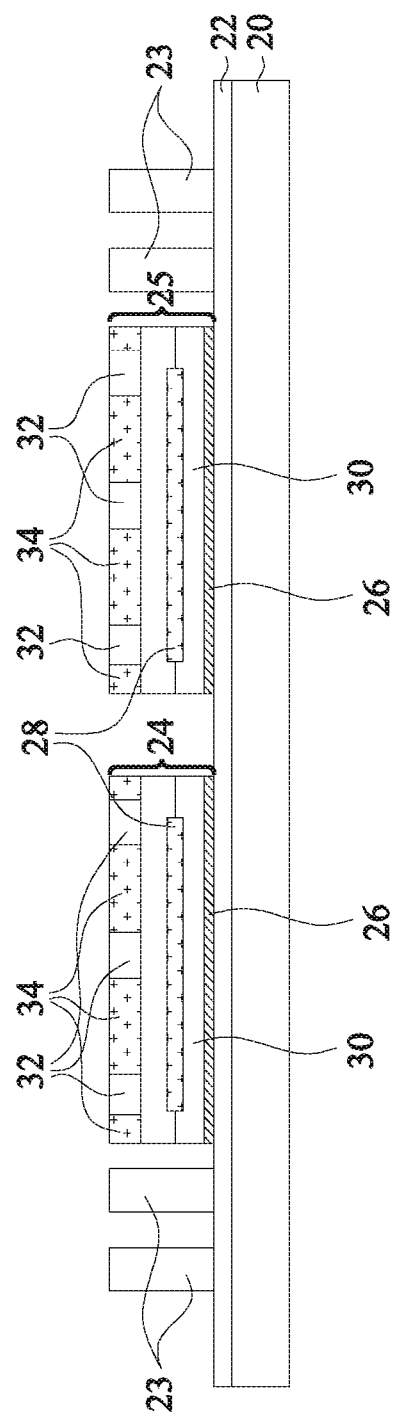

FIG. 3 illustrates the placement of device dies 24 and 25. The respective step is step 404 as shown in FIG. 16. Device dies 24 and 25 are placed over release layer 22, for example, through die-attach films 26, which are adhesive films. Device dies 24 and 25 may include active devices 28 such as transistors, which are formed at the surface of the respective semiconductor substrates 30. Device dies 24 and 25 may be logic device dies, including logic transistors therein. In some exemplary embodiments, device dies 24 and 25 are dies that are designed for mobile applications and may include a Power Management Integrated Circuit (PMIC) die and a Transceiver (TRX) die, for example. Although two dies 24 and 25 are illustrated, more dies may be placed over carrier 20 and level with each other.

In some exemplary embodiments, metal pillars 32 (such as copper posts) are formed as the top portions of device dies 24 and 25 and are electrically coupled to the devices in device dies 24 and 25. In some embodiments, dielectric layers 34 are formed on the top surfaces of device dies 24 and 25, with metal pillars 32 having at least lower portions in dielectric layers 34. The top surfaces of dielectric layers 34 may also be substantially level with the top ends of metal pillars 32. Dielectric layers 34 may comprise an organic material, which may also be a polymer. For example, dielectric layers 34 may comprise polybenzoxazole (PBO), polyimide, benzocyclobutene (BCB), or the like. Alternatively, dielectric layers 34 are not formed, and metal pillars 32 protrude above the remaining portions of device dies 24 and 25.

Figure 4:
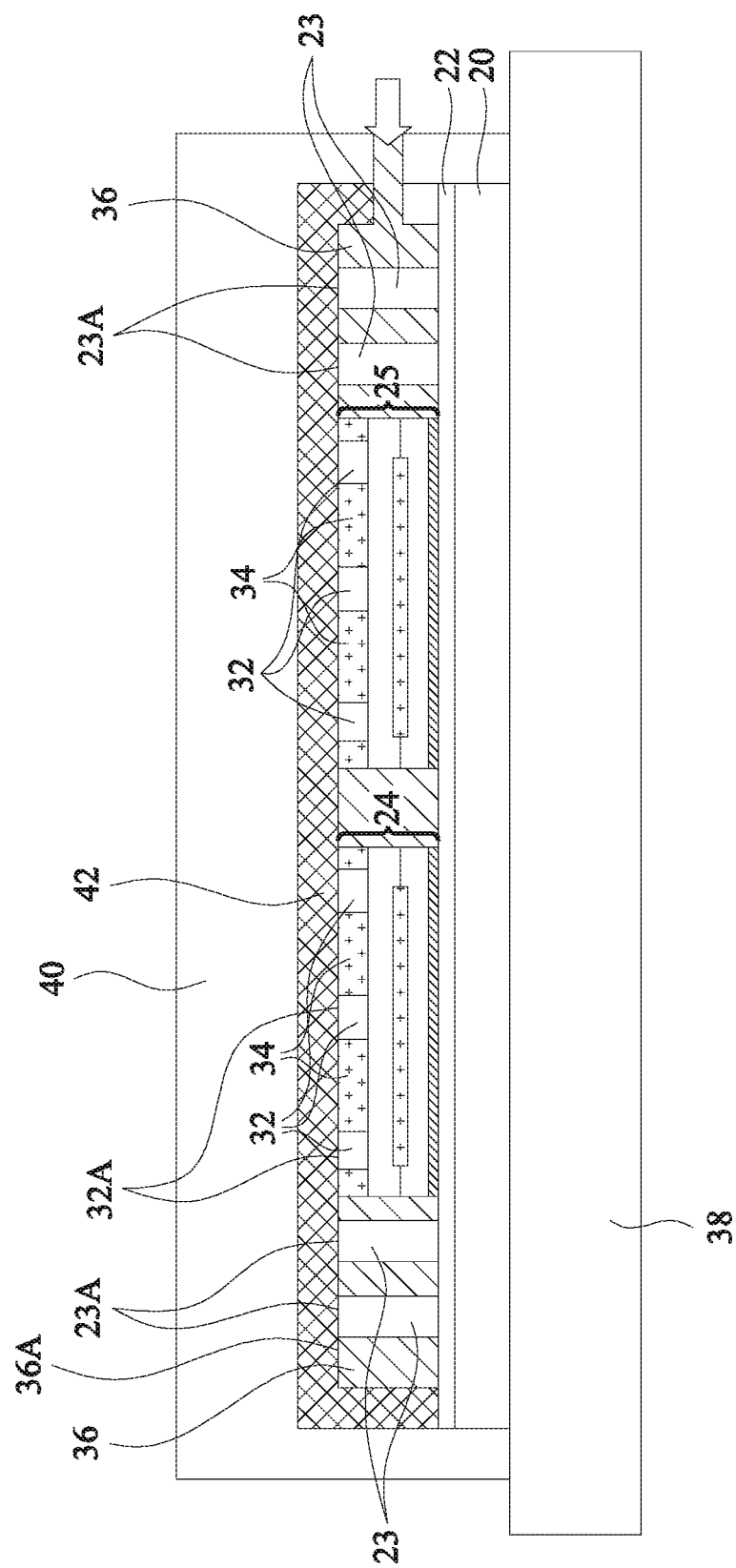

Referring to FIG. 4, molding material 36 is molded on device dies 24 and 25 and through-vias 23. The respective step is step 406 as shown in FIG. 16. Molding material 36 fills the gaps between device dies 24 and 25 and through-vias 23 and may be in contact with release layer 22 in accordance with some embodiments. Furthermore, molding material 36 may be filled into the gaps between metal pillars 32 when metal pillars 32 protrude above the remaining portions of device dies 24 and 25. Molding material 36 may include a molding compound, a molding underfill, an epoxy, or a resin in some embodiments.

In accordance with some embodiments of the present disclosure, the molding process is performed through expose molding. For example, the structure in FIG. 3 is placed over lower mold chase 38, and upper mold chase 40 is placed on the structure in FIG. 3. Upper mold chase 40 includes a top portion over device dies 24 and 25 and a ring portion encircling device dies 24 and 25. Release film 42 lies at the inner surface of upper mold chase 40. Release film 42 is formed of a relatively soft material. Accordingly, the top surfaces of metal pillars 32, through-vias 23, and dielectric layer 34 may be in contact with the bottom surface of release film 42 with no gap left.

In the molding process, molding material 36 is injected into the space in upper mold chase 40 to mold devices 24 and 25 and through-vias 23 therein. Since the top surfaces of metal pillars 32, through-vias 23, and dielectric layer 34 are in contact with release film 42, after the molding process, the top surfaces of pillars 32 and through-vias 23 are exposed. Accordingly, there is no need to perform a grinding process to expose metal pillars 32 and through-vias 23. This results in a reduction in the manufacturing cost.

In alternative embodiments of the present disclosure, molding methods other than expose molding are used. In these embodiments, after the molding process, the top surfaces of metal pillars 32 and through-vias 23 are covered by molding material 36. According, a grinding step is performed on molding material 36 until metal pillars 32 and through-vias 23 are exposed. Due to the expose molding or the grinding, the top ends 23A of through-vias 23 are coplanar, or substantially coplanar, with the top ends 32A of metal pillars 32 and are substantially coplanar with top surface 36A of molding material 36. After the molding process, release film 42, upper mold chase 40, and lower mold chase 38 are removed.

Figure 5:
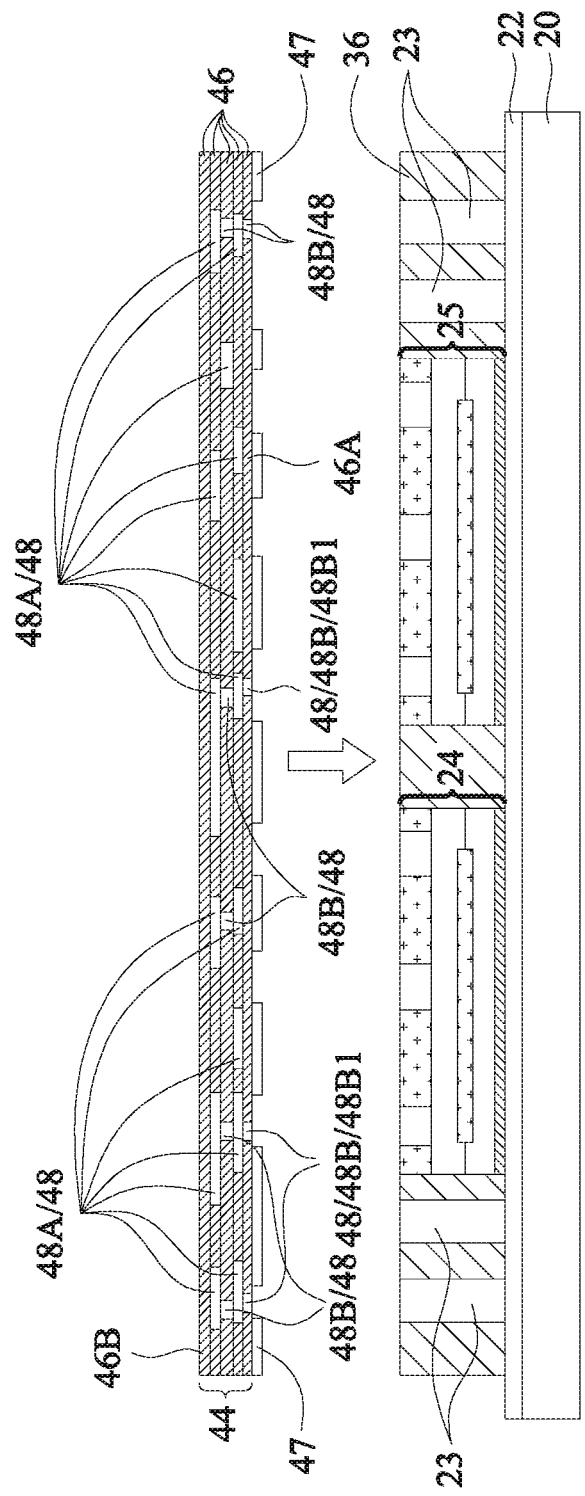

Next, as shown in FIG. 5, in accordance with some embodiments of the present disclosure, pre-formed substrate 44 is adhered to molding material 36. The respective step is step 408 as shown in FIG. 16. Substrate 44 includes dielectric layers 46 and Redistribution Lines (RDLs) 48 embedded in dielectric layers 46. Substrate 44 may include one, two, three, or more RDLs, with vias interconnecting neighboring RDL layers. In accordance with some embodiments of the present disclosure, dielectric layers 46 are formed of organic dielectric materials such as polymers. RDLs 48 are formed of metal or metal alloys in some embodiments. For example, RDLs 48 may be formed of copper, aluminum, nickel, or alloys thereof. RDLs 48 also include metal traces 48A, which form one or more redistribution layers, and metal vias 48B interconnecting neighboring redistribution layers. In accordance with some embodiments, substrate 44 is flexible and may be rolled into a roll before adhered to molding material 36.

In accordance with some embodiments of the present disclosure, dielectric layers 46 include top layer 46B, which covers the top redistribution layer. No conductive features in substrate 44 are exposed through top dielectric layer 46B in some embodiments. In alternative embodiments, there are some RDLs 48 exposed through top dielectric layer 46B. There may also be some metal vias 48B1 exposed through, and level with, the bottom surface of the bottom dielectric layer 46A.

Figure 6:
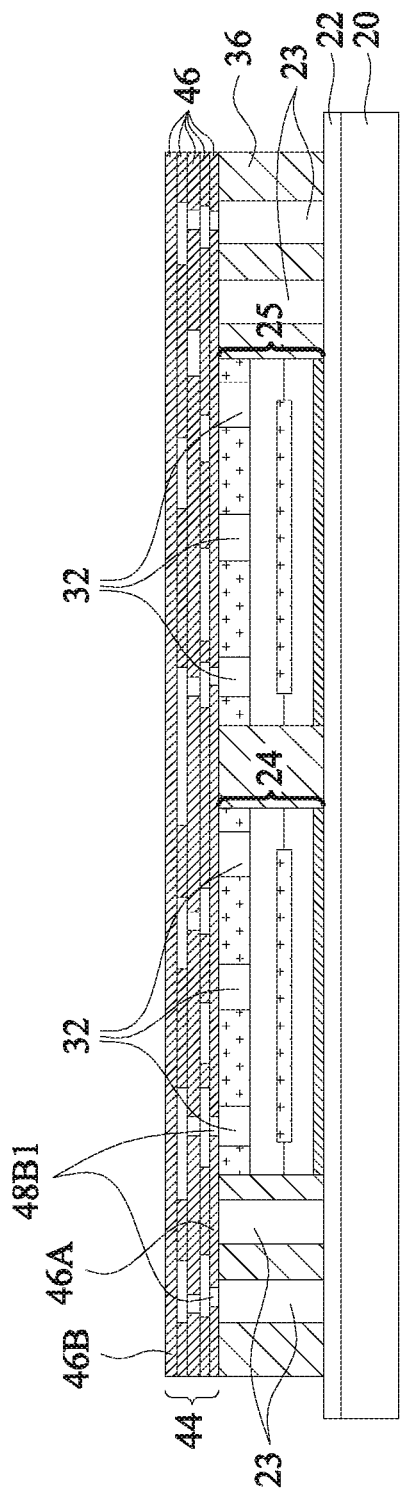

In accordance with some embodiments of the present disclosure, to attach substrate 44 to molding material 36, liquid adhesive 47 is applied to the bottom surface of dielectric layer 46A. The exposed metal vias 48 may not be applied with the liquid adhesive 47 to prevent adhesive 47 from affecting the electrical conductivity of metal vias 48B. After substrate 44 is attached to molding material 36, adhesive 47 adheres substrate 44 to molding material 36. Furthermore, metal vias 48B1 are in contact with, and hence are electrically connected to, some metal pillars 32 and/or through-vias 23. The resulting structure is shown in FIG. 6. In subsequent figures, liquid adhesive 47 is not illustrated since most of adhesive 47 is evaporated.

Figure 7:
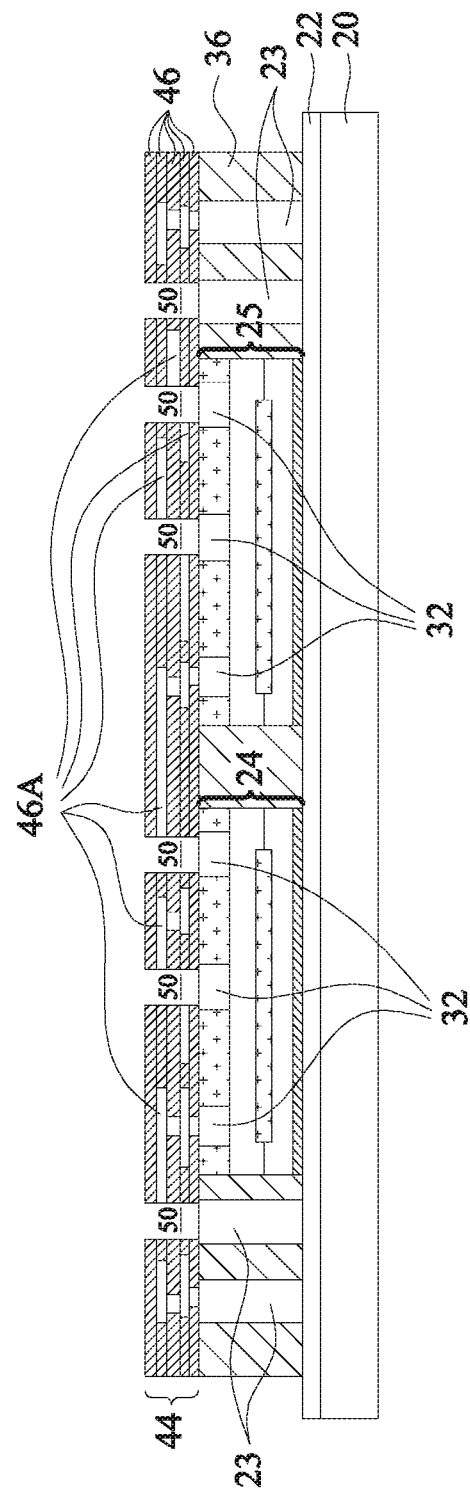

Next, as shown in FIG. 7, dielectric layers 46 are patterned, for example, in a lithography process in accordance with some embodiments of the present disclosure. In some embodiments, a photo resist (not shown) is applied over dielectric layers 46. The photo resist is patterned through light-exposure and developing. Dielectric layers 46 are then etched to form openings 50. The respective step is step 410, as shown in FIG. 16. Openings 50 penetrate through substrate 44 and are referred to as through-openings 50 throughout the description. Some of metal pillars 32 and/or through-vias 23 are exposed through through-openings 50. In addition, some of metal traces 48A have their sidewalls exposed to through-openings 50. In alternative embodiments, dielectric layers 46 are formed of light-sensitive materials such as polyimide and PBO. Accordingly, in the patterning for forming through-openings 50, no photo resist is needed.

In accordance with alternative embodiments of the present disclosure, substrate 44 is pre-formed with through-openings 50 before attached to molding material 36.

Next, as shown in FIG. 8, through-vias 52 are formed to penetrate through substrate 44 in accordance with some embodiments of the present disclosure. The respective step is step 412, as shown in FIG. 16. In accordance with some embodiments, the formation includes a plating process, which may be an electroless plating process. The plating may be performed until the top surfaces of through-vias 52 are slightly higher than the top surface of top dielectric layer 46B. A light grinding is then performed to make the top surfaces of through-vias 52 coplanar with the top surface of top dielectric layer 46B. In alternative embodiments, the plating is performed when the top surfaces of through-vias 52 are level with or slightly lower than the top surface of top dielectric layer 46B. Through-vias 52 may include copper, aluminum, nickel, silver, or alloys thereof.

As shown in FIG. 8, through-vias 52 may have the shapes of rods and may have top-view shapes of circles, squares, rectangles, hexagons, or other shapes. The sidewalls 52' of through-vias 52 may be straight in accordance with some embodiments of the present disclosure. Furthermore, sidewalls 52' may be perpendicular to the major top surface 44A of substrate 44. Alternatively, sidewalls 52' are slightly tilted. Accordingly, the top widths W1 of through-vias 52 may be greater than the bottom widths W2 of the respective through-vias 52.

Through-vias 52, as shown in FIG. 8, penetrate through all dielectric layers in substrate 44. Sidewalls 52' of some through-vias 52 may be attached to the sidewalls of some metal traces 48A in accordance with some embodiments of the present disclosure. Accordingly, some through-vias 52 are electrically connected to metal traces 48A.

Since through-vias 52 and metal traces 48A are formed in different process steps, there may be distinguishable interfaces between the sidewalls of through-vias 52 and the sidewalls of metal traces 48A. In accordance with some embodiments of the present disclosure, the material of through-vias 52 is different from the material of metal traces 48A. For example, through-vias 52 may include a metal (or a non-metal element) that is not in metal traces 48A, or metal traces 48A may include a metal (or a non-metal element) that is not in through-vias 52. In other exemplary embodiments, through-vias 52 and metal traces 48A may (or may not) include the same types of elements, and the percentages of the elements in through-vias 52 are different from the percentages of the elements in metal traces 48A.

After the plating of through-vias 52, a thermal process is performed in accordance with some embodiments of the present disclosure. In the thermal process, some contents, such as the solvents, of the adhesive (47 in FIG. 5) that adhere substrate 44 to molding material 36 are removed through vaporization. In addition, in the thermal process, the metals in metal vias 48B1 may inter-diffuse with the metals in metal pillars 32 and through-vias 23 to form bonds. In accordance with some exemplary embodiments, the thermal process is performed at a temperature in the range between about 150° C. and about 170° C. The duration of the thermal process may be in the range between about 20 minutes and about 1 hour.

Figure 10:
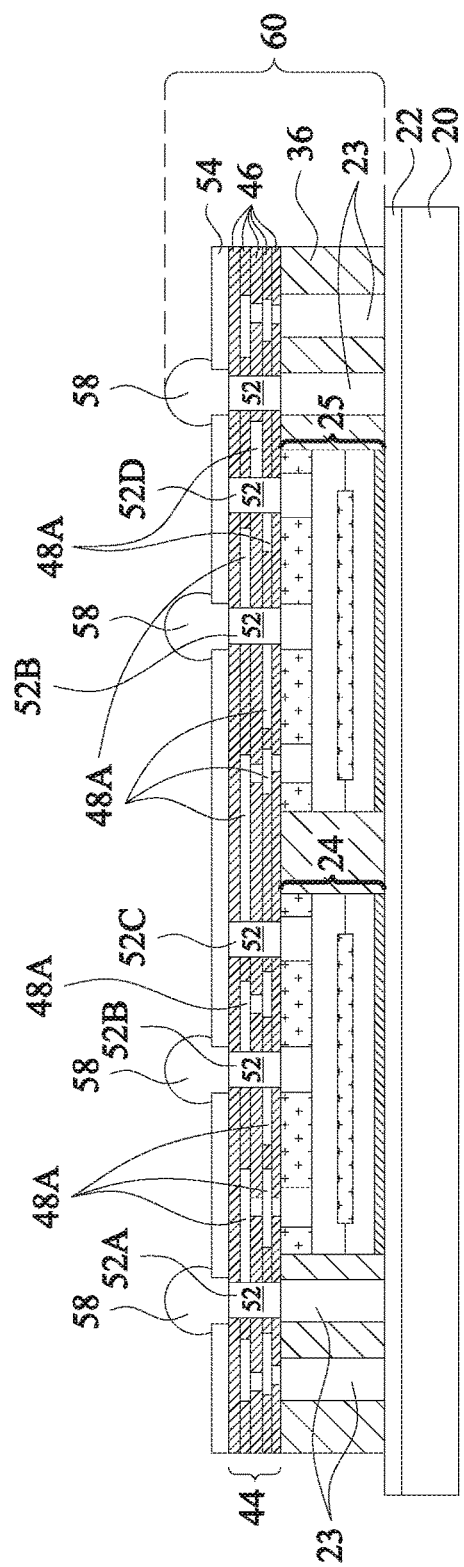

Through-vias 52 has two functions in the embodiments of the present disclosure. Firstly, through-vias 52 act as electrical connections. For example, some of through-vias 52 act as the interconnections for interconnecting metal traces 48A. Some of through-vias 52 also electrically connect through-vias 23 and/or metal pillars 32 to the overlying electrical connectors 58 (FIG. 10). Secondly, through-vias 52 help anchor substrate 44 to the underlying through-vias 23 and metal pillars 32, hence helping substrate 44 to better bond to the underlying structure.

Next, referring to FIG. 9, dielectric layer 54 is formed over substrate 44 and then patterned. In accordance with some embodiments, dielectric layer 54 is a solder mask. Dielectric layer 54 may be pre-formed as a film, which is laminated onto substrate 44. Dielectric layer 54 may also be applied in the form of a fluid and then cured. In some embodiments, dielectric layer 54 is formed of a photosensitive material, which may be patterned in a photo lithography process without using an additional photo resist.

Openings 56 are formed in dielectric layer 54 through the patterning process. Through-vias 52 are exposed through openings 56. Next, as shown in FIG. 10, electrical connectors 58 are formed to electrically connect to through-vias 52 in accordance with some embodiments of the present disclosure. The respective step is step 414, as shown in FIG. 16. Electrical connectors 58 include solder balls in some embodiments. In accordance with some embodiments of the present disclosure, the formation of solder balls 58 includes placing solder balls on through-vias 52 and then performing a reflow. In alternative embodiments, the formation of solder balls 58 includes plating solder on through-vias 23 and then reflowing the plated solder. Electrical connectors 58 may also include metal pillars, which may or may not have solder formed thereon. Throughout the description, the structure including device dies 24 and 25, through-vias 23, molding material 36, substrate 44, through-vias 52, dielectric layer 54, and electrical connectors 58 in combination is referred to as package component 60. In some embodiments, package component 60 is a composite wafer, which has the shape of a wafer, for example, with a round top-view shape.

Depending on the connections of through-vias 52, through-vias 52 may have different functions in accordance with the embodiments of the present disclosure. For example, as shown in FIGS. 9 and 10, through-vias 52 includes 52A, 52B, 52C, and 52D, which are connected differently. Through-via 52A is plated from, and is electrically connected to, through-via 23. FIG. 10 illustrates that through-via 52A is connected to one of electrical connectors 58 in accordance with some embodiments. In accordance with alternative embodiments, the top surface of through-via 52A may not be connected to any electrical connector 58. Rather, the top surface of through-via 52A may be in contact with the bottom surface of dielectric layer 54. In these embodiments, through-via 52A is fully covered by dielectric layer 54.

Through-vias 52B are plated from, and are electrically connected to, metal pillars 32. The top surfaces of through-vias 52B are joined to the respective electrical connectors 58. Accordingly, through-vias 52B electrically interconnect electrical connectors 58 and metal pillars 32. Furthermore, through-vias 52B may be electrically connected to redistribution lines 48A and hence may also function as the vias for interconnecting redistribution lines 48A in different redistribution layers.

The top surfaces of through-vias 52C and 52D are not connected to any electrical connector 58. Rather, the top surface of through-vias 52C and 52D are in contact with the bottom surface of dielectric layer 54. In accordance these embodiments, the respective through-vias 52C and 52B may or may not have electrical functions. For example, through-via 52C has the electrical function to electrically connect to redistribution line 48A, metal pillar 32, etc. In some other embodiments, through-via 52D is a dummy via that is electrically floating. In these embodiments, through-via 52D may be plated starting from metal pillar 32, as shown in FIG. 10, or starting from through-via 23 (not shown). In addition, when through-via 52D is a dummy via, it may be connected to some redistribution lines 48A, as shown in FIG. 10, or may not be connected to any redistribution line. An advantageous feature for forming dummy through-via 52D is to improve the strength of the bond between substrate 44 and the underlying structure.

Figure 11:
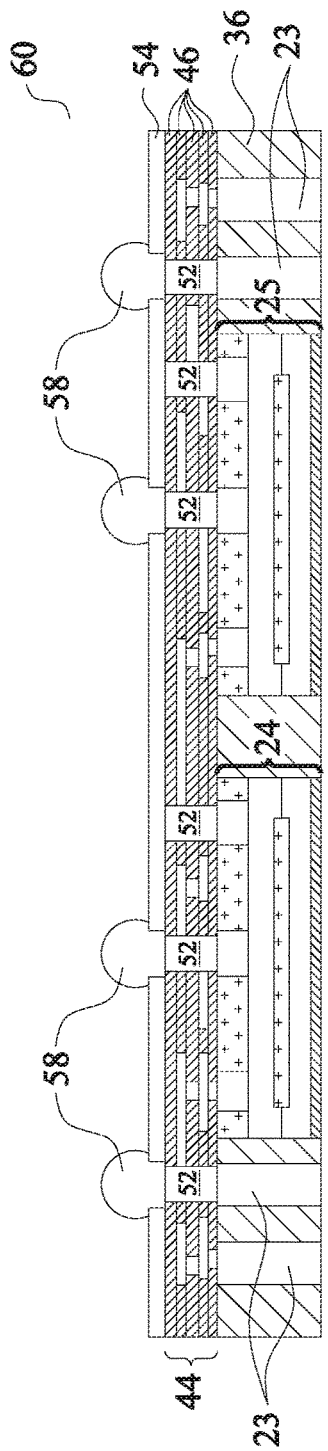

Next, package component 60 is demounted from carrier 20. The resulting package component 60 is shown in FIG. 11. In some embodiments, release layer 22 (FIG. 10) comprises a LTHC material, which decomposes when exposed to laser light or Ultra-Violet (UV) light. In alternative embodiments, release layer 22 (FIG. 10) is an UV adhesive, which loses adhesion when exposed to UV light. Accordingly, in the demounting of package component 60, a laser light or UV light is projected on release layer 22 through carrier 20 so that carrier 20 may be removed.

Figure 12:
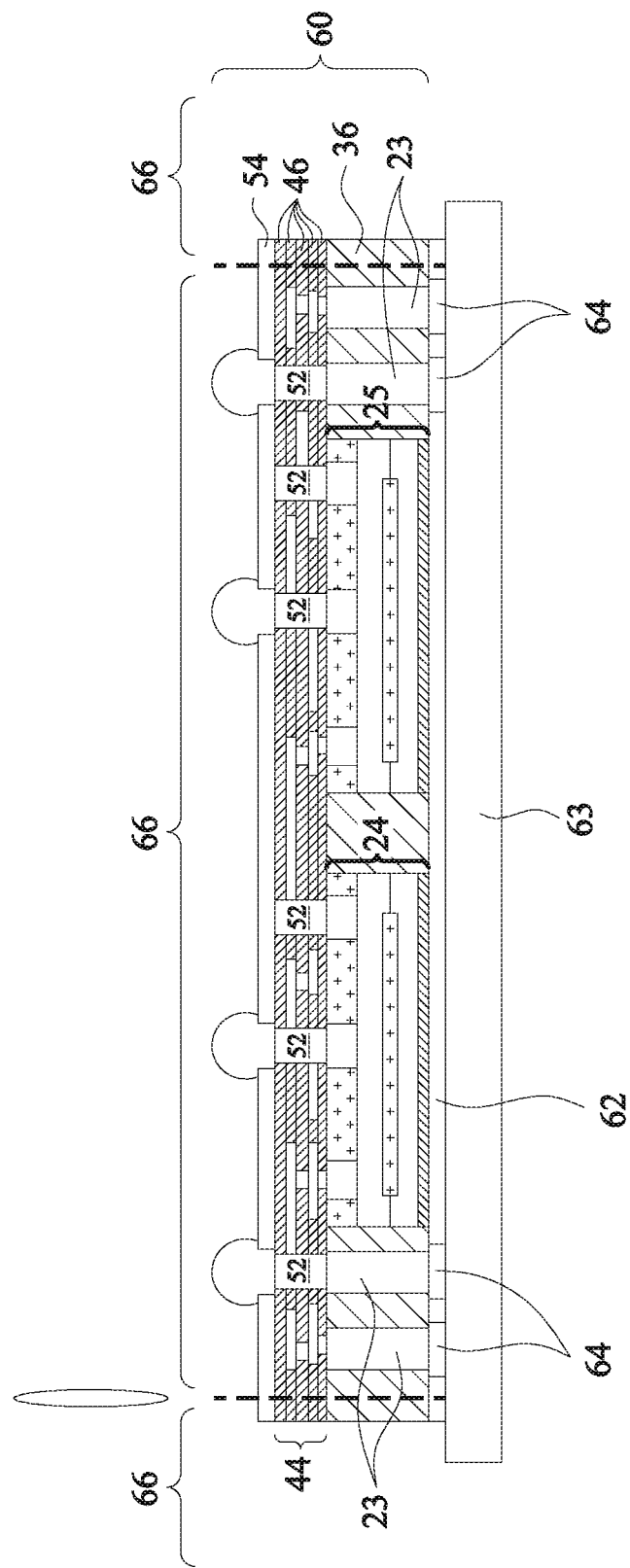

Referring to FIG. 12, dielectric layer 62 and metal pads 64 are formed. Dielectric layer 62 and substrate 44 are on the opposite sides of molding material 36. Dielectric layer 62 may be selected from the same candidate material for forming dielectric layer 54. Metal pads 64 may comprise copper, aluminum, nickel, or the like. In alternative embodiments, the formation of dielectric layer 62 and metal pads 64 is skipped, and hence in the resulting Package-on-Package (PoP) package as shown in FIG. 13, solder regions 206 may directly contact through-vias 23.

Figure 13:
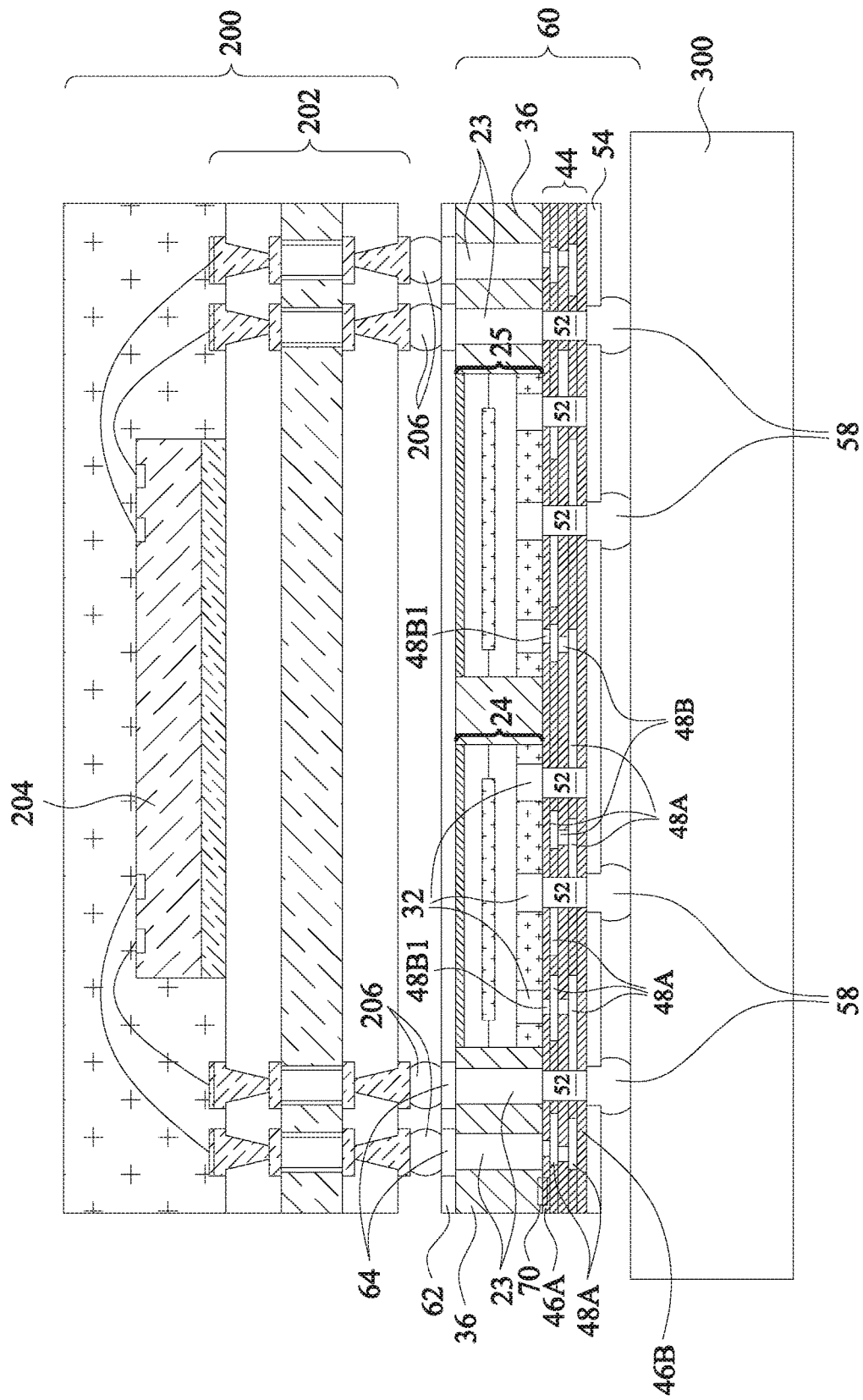

Next, as also shown in FIG. 13, dicing tape 63 is attached to one side of package component 60. A die-saw process is then performed to saw package component 60 into a plurality of packages 66, which may be identical to each other. The respective step is shown as step 416 as shown in FIG. 16.

FIG. 13 illustrates the bonding of one of packages 66 to form a PoP structure. Package 66 is bonded to package 200 and Printed Circuit Board (PCB) 300. In some embodiments, package 200 includes package substrate 202 and device die 204 bonded to package substrate 202. The bonding of device die 204 to package substrate 202 may be achieved through wire bonding, flip-chip bonding, or the like. Solder regions 206 bond package 200 to package 66, wherein solder regions 206 may be in contact with metal pads 64. Solder regions 58 bonds package 66 to PCB 300.

Figure 14:
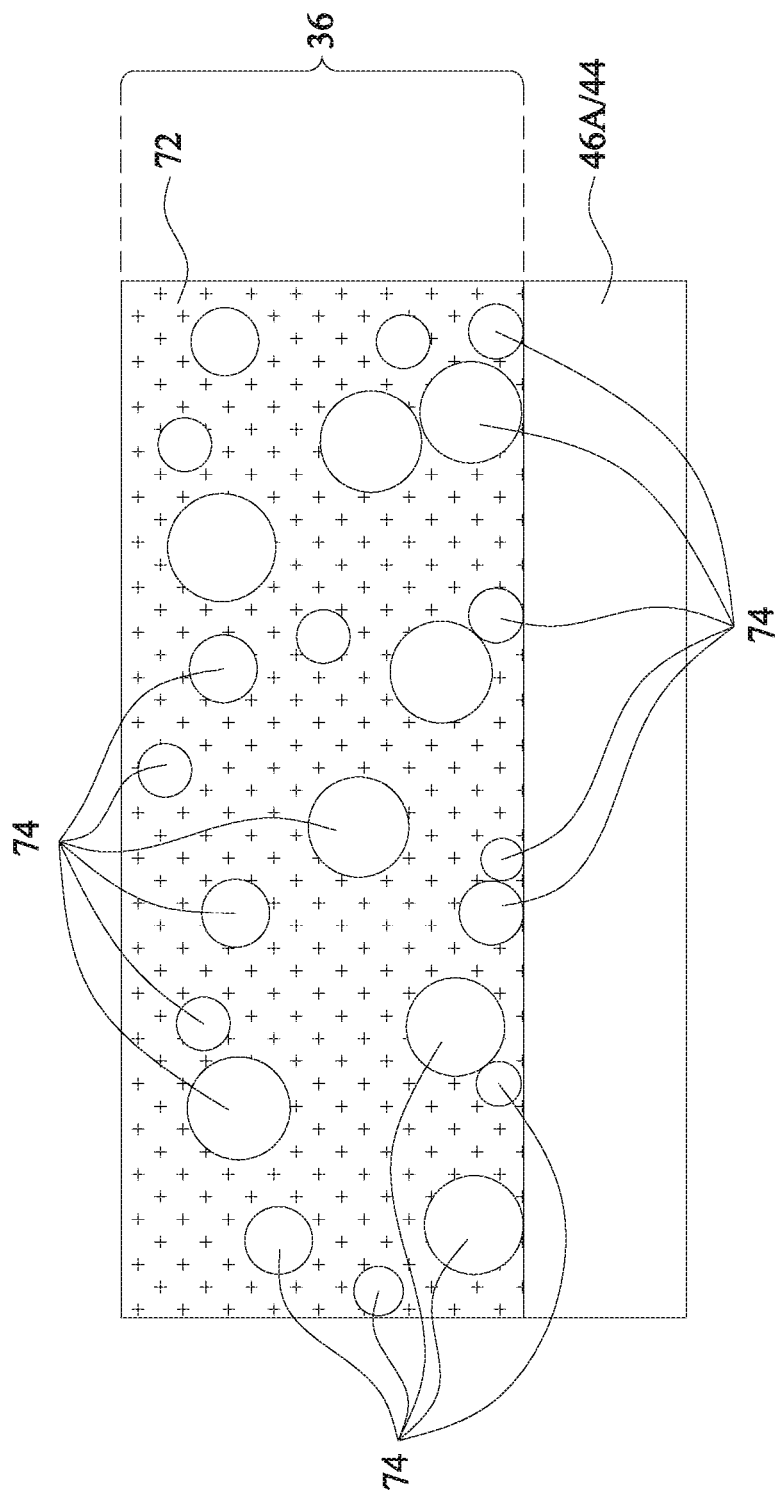
FIG. 14 illustrates a magnified view of a portion of a package in accordance with some embodiments.

In the embodiments of the present disclosure, expose molding is performed (FIG. 4) to mold device dies 24 and 25. As a result of the expose molding, no grinding is needed, although it may also be performed. FIG. 14 schematically illustrates a magnified view of portion 70 (FIG. 13) of package 66. The magnified view illustrates the interface between molding material 36 and dielectric layer 46A of substrate 44. As shown in FIG. 14, molding material 36 includes material 72 (which is a fluid when molding is performed) and filler particles 74. Material 72 may be a polymer, a resin, an epoxy, or the like. Filler particles 74 have spherical shapes. The sizes of Filler particles 74 may be different from each other. The sizes of Filler particles 74 may range from about 2 μm to about 20 μm, and larger or smaller filler particles 74 may exist. Filler particles 74 may be formed of a non-organic material such as glass, $SiO_2$, $Al_2O_3$, or the like. Since no grinding is performed, the spherical shapes of filler particles 74 are maintained, with no filler particles 74, or substantially no particles 74 have partial spherical shapes that include flat surfaces coplanar with the interface between molding material 36 and dielectric layer 46A of substrate 44. Rather, the ends of filler particles 74 touching the interface are rounded.

Figure 15:
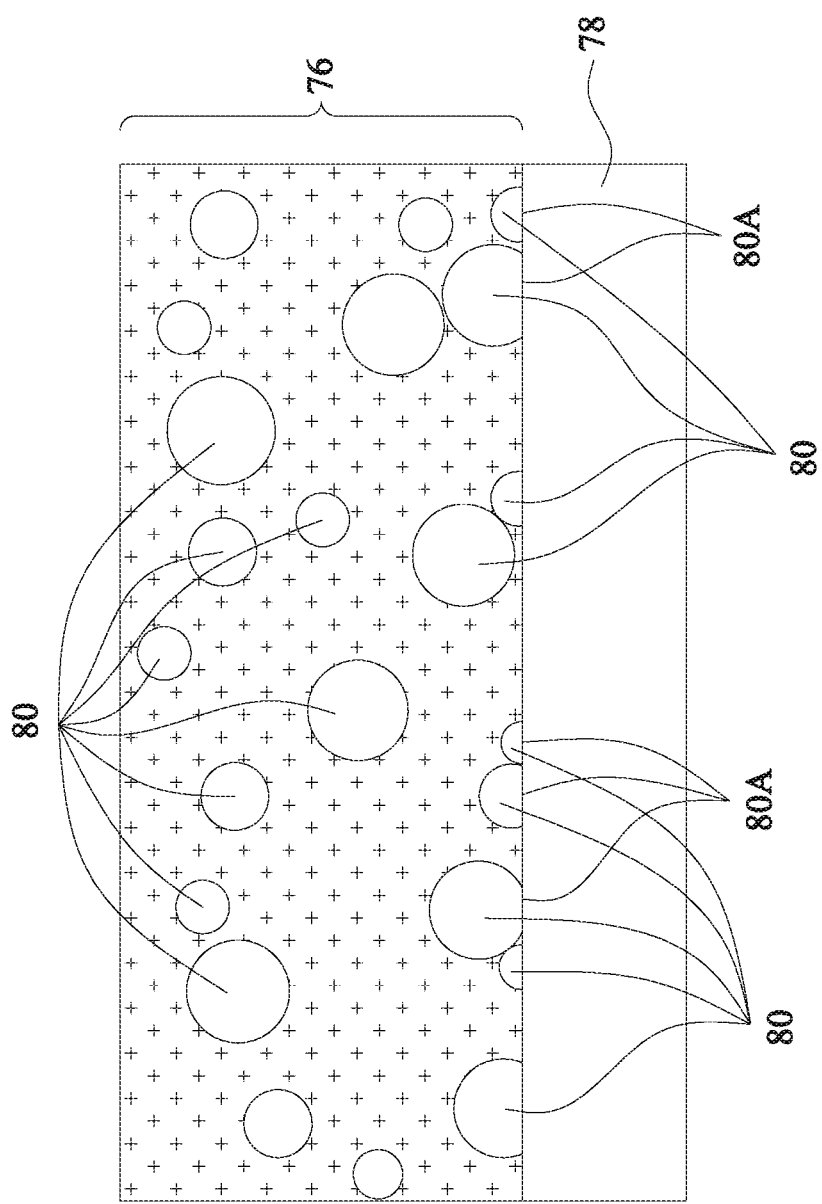
FIG. 15 illustrates a magnified view of a portion of a conventional package.

As a comparison, FIG. 15 illustrates a structure includes molding material 76 interfacing dielectric layer 78, wherein a grinding process is performed on molding material 76 in the formation of the respective package. When molding material 76 is grinded, filler particles 80 in molding material 76 are also grinded, resulting in parts of some filler particles 80 to be removed. As a result, some filler particles 80 include flat surfaces 80A that are coplanar with the interface between molding material 76 and dielectric layer 78.

The embodiments of the present disclosure have some advantageous features. In the molding of the device dies, expose molding is used. This saves a grinding process for grinding the respective molding material. Accordingly, the manufacturing cost is reduced. In addition, the pre-formed substrate used in the embodiments according to the present disclosure may have lower cost than the conventionally used package substrate and interposer. Hence, manufacturing cost is further lowered.

In accordance with some embodiments of the present disclosure, a method includes molding a device die in a molding material, wherein a metal pillar of the device die is exposed through a surface of the molding material. A substrate is adhered to the molding material. The substrate includes a redistribution layer that further includes redistribution lines. A plating is performed to fill a through-opening in the substrate to form a through-via. The through-via is plated on the metal pillar of the device die. An electrical connector is formed to electrically couple to the through-via.

In accordance with alternative embodiments of the present disclosure, a method includes molding a device die in a molding material using expose molding, wherein a metal pillar of the device die is exposed after the expose molding. The method further includes attaching a substrate to the molding material, wherein the substrate includes a plurality of redistribution layers. A through-opening is formed in the substrate to expose the metal pillar. The method further includes plating into the through-opening to form a through-via, wherein the through-via is plated on the metal pillar of the device die.

In accordance with yet alternative embodiments of the present disclosure, a package includes a device die that further includes a metal pillar, a molding material molding the device die therein, with a top surface of the first metal pillar coplanar with a surface of the molding material. A substrate is over and attached to the molding material. The substrate includes a plurality of redistribution layers and a through-via penetrating through the substrate. The through-via is in contact with the metal pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a device die comprising a metal pillar;
an encapsulating material encapsulating the device die therein, with the device die exposed through the encapsulating material; and
a substrate over and attached to the encapsulating material, wherein the substrate comprises:
a plurality of dielectric layers;
a plurality of redistribution layers in the plurality of dielectric layers;

a first through-via penetrating through the plurality of dielectric layers, wherein the first through-via is in contact with the metal pillar, and the first through-via is in contact with a sidewall of a redistribution line in the plurality of redistribution layers; and a solder region in contact with a top surface of the first through-via.

2. The package of claim 1, wherein the first through-via comprises a substantially straight edge extending from a top surface to a bottom surface of the plurality of dielectric layers.

3. The package of claim 1 further comprising:
a dielectric solder mask contacting the top surface of the substrate, wherein the dielectric solder mask and the device die are on opposite sides of the substrate, and the solder region penetrates through the dielectric solder mask.

4. The package of claim 1 further comprising:
a second through-via penetrating through the encapsulating material; and
a third through-via penetrating through the substrate, wherein the third through-via is in contact with the second through-via.

5. The package of claim 1 further comprising an electrical path extending into the plurality of dielectric layers, wherein the electrical path comprises portions of a plurality of redistribution lines in different ones of the dielectric layers, and edges of the portions of the plurality of redistribution lines are not flushed with each other.

6. The package of claim 1, wherein the first through-via penetrates through the plurality of dielectric layers, and the plurality of dielectric layers comprises a bottom dielectric layer having a bottom surface contacting a top surface of the encapsulating material, and the first through-via extends to the bottom surface of the bottom dielectric layer.

7. The package of claim 1, wherein the first through-via has no distinguishable interface therein.

8. A package comprising:
a device die;
an encapsulating material encapsulating the device die therein; and
a substrate over and adhered to both the device die and the encapsulating material, wherein the substrate comprises:
a plurality of redistribution lines formed of a first conductive material; and
a through-via penetrating through the substrate, wherein the through-via is formed of a second conductive material different from the first conductive material, and wherein the through-via comprises:
a first edge contacting an edge of a first redistribution line in the substrate; and
a second edge contacting an edge of a second redistribution line in the substrate, wherein the first redistribution line and the second redistribution line are in different dielectric layers of the substrate.

9. The package of claim 8, wherein the through-via has a substantially straight edge extending from a top surface to a bottom surface of the substrate, and the plurality of redistribution lines is connected to form an electrical path extending through a plurality of dielectric layers in the substrate, and the electrical path does not have a substantially straight edge extending into all of the plurality of dielectric layers.

10. The package of claim 8 further comprising a plurality of dielectric layers, with the plurality of redistribution lines in the plurality of dielectric layers, wherein the through-via penetrates through the plurality of dielectric layers.

11. The package of claim 8, wherein the first redistribution line and the second redistribution line are on opposite sides of the through-via.

12. The package of claim 8, wherein the through-via has a bottom surface, and the device die comprises a metal pillar having a top surface contacting the bottom surface of the through-via.

13. The package of claim 8 further comprising an additional through-via penetrating through the encapsulating material, wherein the through-via has a bottom surface contacting a top surface of the additional through-via.

14. A package comprising:
a device die comprising a metal pillar;
a metal post;
an encapsulating material molding the device die and the metal post therein;
an adhesive layer over the encapsulating material; and
a substrate over and attached to the encapsulating material through the adhesive layer, wherein the substrate comprises:
a plurality of dielectric layers, wherein a bottom dielectric layer in the plurality of dielectric layers has a bottom surface in contact with the adhesive layer; and
a first through-via and a second through-via penetrating through the substrate, wherein the first through-via and the second through-via are in contact with the metal post and the metal pillar, respectively, wherein the first through-via comprises:
a first edge contacting an edge of a first redistribution line in the substrate; and
a second edge contacting an edge of a second redistribution line in the substrate, wherein the first redistribution line and the second redistribution line are on opposite sides of the first through-via.

15. The package of claim 14 further comprising a plurality of redistribution lines in the substrate, wherein the first through-via is formed of a different metallic material than the plurality of redistribution lines.

16. The package of claim 14 further comprising:
a solder mask over and contacting the substrate; and
a solder region extending into the solder mask to contact one of the first through-via and the second through-via.

17. The package of claim 14, wherein each of the first through-via and the second through-via has a substantially straight sidewall extending into the plurality of dielectric layers in the substrate.

18. The package of claim 14, wherein the first redistribution line and the second redistribution line are in different dielectric layers of the substrate.

19. The package of claim 14, wherein the first through-via further extends to a bottom surface of the bottom dielectric layer.

20. The package of claim 14, wherein the first through-via has no distinguishable interface therein.

* * * * *